United States Patent
Scherer et al.

(10) Patent No.: US 8,506,863 B1
(45) Date of Patent: Aug. 13, 2013

(54) METHOD FOR ADHERING A MICROFLUIDIC CHIP TO A SUBSTRATE

(75) Inventors: Axel Scherer, Barnard, VT (US); Aditya Rajagopal, Irvine, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 13/541,512

(22) Filed: Jul. 3, 2012

Related U.S. Application Data

(62) Division of application No. 12/572,036, filed on Oct. 1, 2009, now Pat. No. 8,241,547.

(60) Provisional application No. 61/194,969, filed on Oct. 2, 2008.

(51) Int. Cl.
*B29C 65/00* (2006.01)

(52) U.S. Cl.
USPC ........... 264/135; 264/139; 264/154; 264/248; 264/274; 264/273

(58) Field of Classification Search
None
See application file for complete search history.

(56) References Cited

U.S. PATENT DOCUMENTS

| | | | |
|---|---|---|---|
| 6,790,599 B1 * | 9/2004 | Madou | 430/320 |
| 8,158,728 B2 * | 4/2012 | DeSimone et al. | 525/403 |
| 8,241,547 B2 | 8/2012 | Scherer et al. | |
| 2002/0187260 A1 | 12/2002 | Sheppard et al. | |
| 2004/0061257 A1 * | 4/2004 | Meiners et al. | 264/271.1 |
| 2005/0003521 A1 | 1/2005 | O'Connor et al. | |
| 2006/0237080 A1 * | 10/2006 | Jon et al. | 137/883 |
| 2007/0026682 A1 | 2/2007 | Hochberg et al. | |
| 2007/0116609 A1 * | 5/2007 | Baeuerle et al. | 422/100 |
| 2007/0166992 A1 | 7/2007 | Daubenspeck et al. | |
| 2012/0024396 A1 * | 2/2012 | Ehrenpfordt et al. | 137/15.01 |
| 2012/0256354 A1 * | 10/2012 | DeSimone et al. | 264/447 |

OTHER PUBLICATIONS

Restriction Requirement mailed on Nov. 17, 2011 for U.S. Appl. No. 12/572,036, filed Oct. 1, 2009 in the name of Axel Scherer et al.
Non-Final Office Action mailed on Feb. 13, 2012 for U.S. Appl. No. 12/572,036, filed Oct. 1, 2009 in the name of Axel Scherer et al.
Notice of Allowance mailed on Jun. 13, 2012 for U.S. Appl. No. 12/572,036, filed Oct. 1, 2009 in the name of Axel Scherer et al.

* cited by examiner

*Primary Examiner* — Edmund H. Lee
(74) *Attorney, Agent, or Firm* — Steinfl & Bruno, LLP

(57) ABSTRACT

A method for adhering two layers of materials is described. An additional layer of material deposited on one of the layers is used. The additional layer of material is perforated and undercut by etching away one of the layers thereby generating anchor shaped holes. The other layer is then deposited on the additional layer filling the anchor shaped holes therefore, providing adhesion.

3 Claims, 6 Drawing Sheets

METHOD FOR ADHERING A MICROFLUIDIC CHIP TO A SUBSTRATE

CROSS REFERENCE TO RELATED APPLICATIONS

The present application is a divisional of U.S. application Ser. No. 12/572,036, filed on Oct. 1, 2009, which in turn claims priority to U.S. Prov. App. No. 61/194,969 filed Oct. 2, 2008, all of which are incorporated herein by reference in their entirety.

STATEMENT OF GOVERNMENT GRANT

This invention was made with government support under Grant No. HR0011-04-1-0054 awarded by the Defense Advanced Research Projects Agency. The government has certain rights in the invention.

FIELD

The present disclosure relates to adhesion of materials to each other. In particular, it relates to adhesion of a layer of polymer to another layer of polymer or semiconductor using microstructures. More particularly, it relates to lithographically defined adhesion microstructures.

BACKGROUND

Adhesion of layers to one another typically relies on surface morphology and bonding strength between molecules or atoms on both side of interface. For many materials, covalent or metallic bonds provide excellent adhesion, and care must be taken to avoid contaminants between two materials. Often, this bonding strength is weak, resulting in de-lamination of layers. This is especially difficult to avoid when chemically inert materials such as glass or Teflon have to be bonded to one another. In that case, it is desirable to modify geometry of the bonding interface to increase adhesion of layers.

SUMMARY

According to a first aspect, a method of adhering two layers of materials is provided, comprising: providing a first layer of material, providing a second layer of material different from the first layer of material, providing a third material, depositing the second layer of material on the first layer of material, performing one or more perforations through the second layer of material to expose the first layer of material through the one or more perforations, undercutting the second layer of material through at least one of the one or more perforations to provide at least one anchor shaped having a width larger than the at least one of the one or more perforations and depositing the third material on the undercut second layer of material thus filling the at least one anchor shaped hole by the third material According to a second aspect, a method for adhering a microfluidic chip on a substrate is provided, comprising: providing a substrate, providing a protection layer, providing a microfluidic chip, depositing the protection layer on the substrate, performing one or more perforations through the protection layer to expose the substrate layer through the one or more perforations, undercutting the protection layer through at least one of the one or more perforations to provide at least one anchor shaped hole having a width larger than the at least one of the one or more perforations, and depositing the microfluidic chip on the protection layer thus filling at least one anchor shaped by a portion of the microfluidic chip.

According to a third aspect, a method for adhering a microfluidic chip to a substrate is provided, comprising: providing a first layer, providing a second layer, providing a third layer, providing a fourth layer, providing a fifth layer having at least one microfluidic channel, depositing the second layer on the first layer, depositing the third layer on the second layer, exposing the second layer by forming one or more openings in the third layer, performing one or more perforations through the second layer to expose the first layer through the one or more perforations, undercutting the second layer through at least one of the one or more perforations to provide at least one anchor shaped hole in the first layer, the at least one anchor shaped hole having a width larger than the at least one of the one or more perforations, selectively removing the third layer, depositing the fourth layer on the second layer thus filling the at least one anchor shaped hole, aligning the fifth layer with the fourth layer and bonding the fifth layer to the fourth layer.

Further aspects of the present disclosure are shown in the description, drawings and claims of the present application.

DETAILED DESCRIPTION

Methods to efficiently adhere two layers of material will be described in accordance with the present disclosure. As will be described later, an additional layer will be used to perform adhesion according to the described methods.

Figure 1:
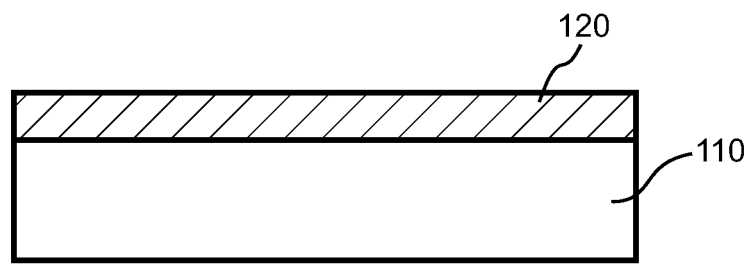
FIG. 1 shows a first layer of material on which a second layer of material is deposited.

FIG. 1 shows a first layer of material (110) and a second layer of material (120). The second layer of material (120) is deposited on the first layer of material (110). Examples of adhering the first layer of material (110) to the second layer of material (120) are deposition using chemical vapor or evaporative means, wafer bonding or sputtering. Some examples of the first layer of material (110) that can be adhered to the second layer of material (120) according to the methods described in the present disclosure include: silicon on silicon dioxide, silicon dioxide on silicon, GaAs on AlGaAs, AlGaAs on GaAs, silicon on silicon nitride, silicon nitride on silicon, silicon nitride on silicon dioxide (or glass), silicon on silicon dioxide (or glass), metals (Au, Ni, Fe, Cu, W, Ti, etc.) on glass, metals on silicon nitride, metals on organic polymers, metals on silicon, metals on other readily etched semiconductors, sifel on silicon or silicon dioxide, teflon or elastomers on semiconductor or insulating substrates and intermetallic materials (NiSi, TiSi, TaSi, MoSi, etc) on silicon or silicon dioxide, According to the present disclosure, the first layer of material (110) and the second layer of material (120) are made from different materials, as will be described later.

Figure 2:
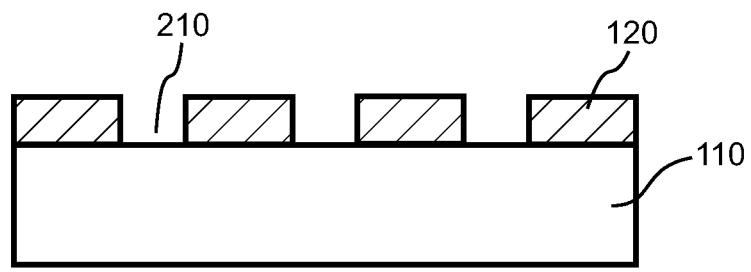
FIG. 2 shows perforations on the second layer of material deposited on the first layer of material.

According to an embodiment of the disclosure, as shown in FIG. 2, perforations (210) are then made in the second layer (120) so that the first layer (110) is exposed through the perforations (210). According to an embodiment of the disclosure, the perforations (210) can have arbitrary geometry and their placement on the second layer (120) does not have to follow any specific pattern. Examples of etching methods used to provide the perforations (210) are ion milling and Reactive Ion Etching (RIE).

Figure 3:
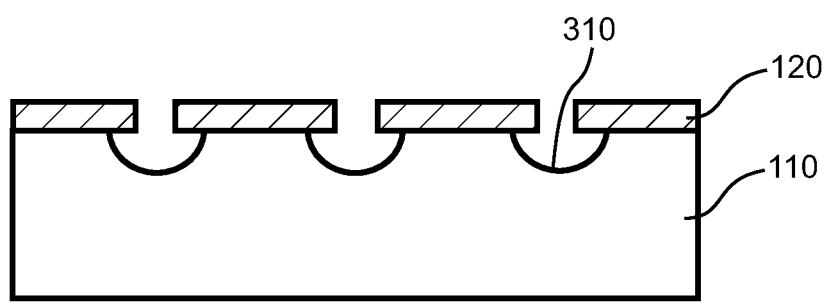
FIG. 3 shows a second layer undercut by etching away the first layer.

As shown in FIG. 3, the second layer (120) is then undercut by etching away the first layer (110) thereby providing anchor shaped holes (310). According to an embodiment of the disclosure, the anchor shaped holes (310) do not have a specific geometry and can be horizontally wider than the perforations (120) to provide more efficient adhesion. According to the present disclosure, anchor shaped holes (310) having dimensions of few nm in length can be fabricated using well known microfabrication methods. According to an embodiment of the disclosure, dimensions of the anchor shaped holes (310) can be defined and controlled by etching time. It is well understood that longer etching time will provide larger holes.

As mentioned above, the first layer (110) and the second layer (120) are made of different materials in order to provide a selective etching of the first layer (110) only. For example, when the first layer (110) is made of silicon dioxide (SiO2) and the second layer (120) is made of silicon, SiO2 can be selectively removed by using Hydrofluoric acid (HF) to which the second layer (120), in this example si, is not sensitive. As another example, when the first layer (110) is made of silicon and the second layer (120) is made of SiO2, Si can be selectively etched away using a fluorine atmosphere. In yet another example where the first layer (110) is made of Indium phosphide (InP) and the second layer (120) is made of InGaAsP or InGaAs, the first layer (110) can be removed by using hydrochloric acid (HCl) without having any impact on the second layer (120). In a further example where the first layer (110) is made of silicon nitride and the second layer (120) is made of SiO2, the first layer (110) can be etched away using phosphoric acid without having any impact on the second layer (120). It is understood that other organic material stacks could also be fabricated from, for example, polymmide on poly methyl methacrylate PMMA or PMMA on photoresist in which the first layer (110) and the second layer (120) are both polymers.

Figure 4:
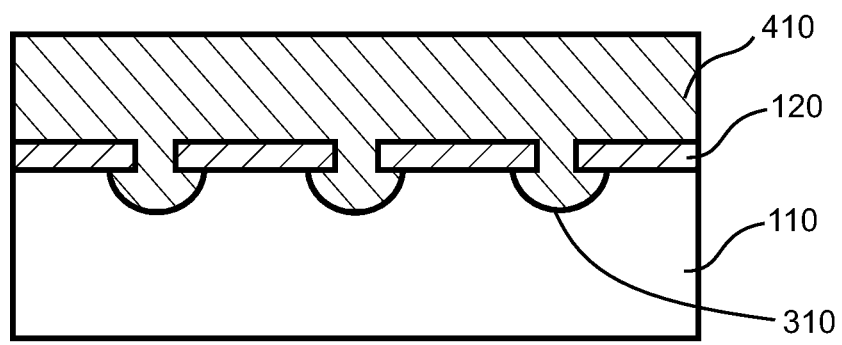
FIG. 4 shows a third material deposited on the second layer of material filling anchor-shaped structures in the first layer of material.

FIG. 4 shows a further step of the method described in the present disclosure. A third material (410) is shown in FIG. 4. The third material (410) is the material which is to be adhered onto the second layer (120). According to an embodiment of the disclosure, the third material (410) is deposited on the second layer (120) so that the third material (410) flows into the anchor shaped holes (310). According to the present disclosure, during this step, the third material (410) is in a liquified state so that the third material (410) can take the three dimensional structure of the anchor shaped holes (310).

According to an embodiment of the disclosure, adhering the third material (410) onto the second layer (120) can be performed using well known fabrication methods such as spin-coating, replication molding, or reflowing. As an example, if the third material (410) is made of metal, the third material (410) is liquified through heating and reflown onto the second layer (120) so that the anchor shaped holes (120) are filled with the third material (410). In such example, a subsequent cooling will solidify the third material (410) thereby providing and efficient adhesion, In another example, when the third material is made of an organic material, going beyond the glass transition temperature of the organic material will result in a liquified version of the third material (410) which will subsequently reflown onto the second layer (120) filling the anchor shaped holes (310). A subsequent cooling will solidify the organinc material resulting in an efficient adhesion.

According to an embodiment of the disclosure, the third material (410) can deposited onto the seond layer (120) by applying a vacuum pump to exhaust air pockets left in the anchor shaped holes (310) thereby forcing the third material (410) to fill the anchor shaped holes (310).

In what follows, a method of sealing a microfluidic chip when adhered to a substrate using the above technique is described in accordance with the present disclosure.

Figure 5A:
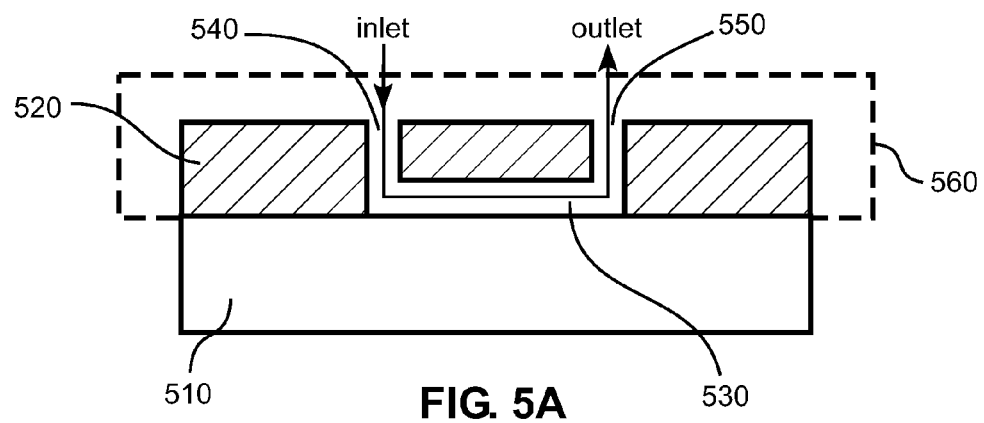
FIG. 5A shows a microfluidic chip adhered conventionally to a substrate.

FIG. 5A shows a structure comprising microfluidic chip (560) (inside broken lines) fabricated out of a top layer (520) and a substrate (510) to the top of which the microfluidic chip (560) is conventionally adhered. As an example, the microfluidic chip (560) and the substrate (510) can be respectively made of polydimethylsiloxane (PDMS) and glass.

Figure 5B:
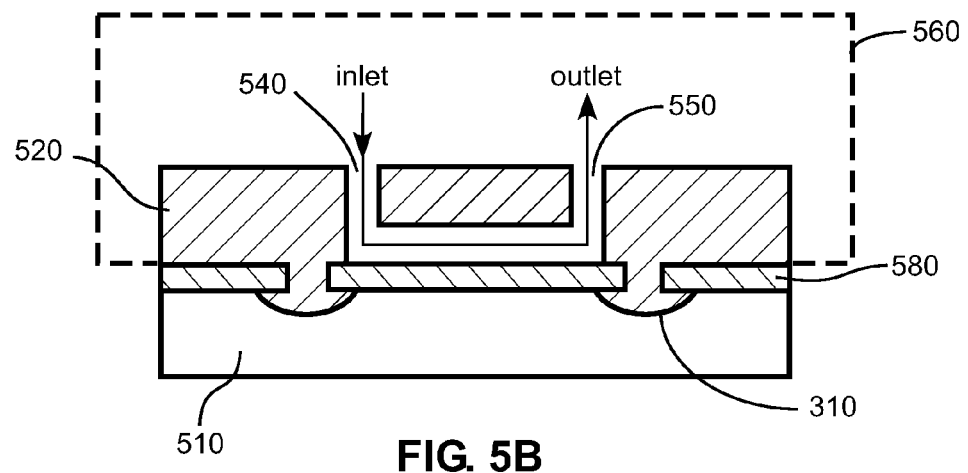
FIG. 5B shows a microfluidic chip adhered to a substrate in accordance with an embodiment of the present disclosure.

An inlet (540), an outlet (550) and a microfluidic channel (530) are also shown in FIG. 5A. Fluid enters the microfluidic channel (530) through the inlet (540) and exits through the outlet (550). One potential issue with such structure is delamination when the fluid is highly pressurized. In other words, applying high pressure may result in delamination of the microfluidic chip (560) from the substrate (510). In what follows, a solution to the issue in accordance with the present disclosure is described FIG. 5B shows a protection layer (580) deposited on the substrate (510) in accordance with an embodiment of the present disclosure. In accordance with the embodiment, the microfluidic chip (560) is adhered to the substrate (510) by way of the teachings of previous FIGS. 1-4. In other words, providing the protection layer (580) and the anchor shaped holes (310) will result in a more efficient adhesion and therefore an improved protection against delamination due to highly pressurized fluid flowing inside the microfluidic chip (560).

Referring to FIGS. 5A-B, in what follows, a more detailed process of adhering a microfluidic chip to a substrate is described in accordance with an embodiment of the present disclosure.

Figure 6A:
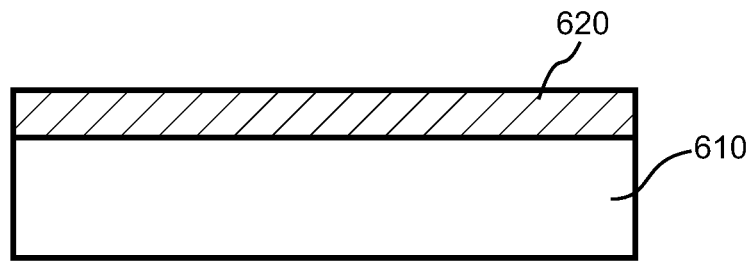
FIG. 6A shows a cross sectional view of a silicon layer deposited on a SiO2 layer.

FIG. 6A shows a silicon layer (620) deposited on a SiO2 layer (610) according to an embodiment of the disclosure.

Figure 6B:
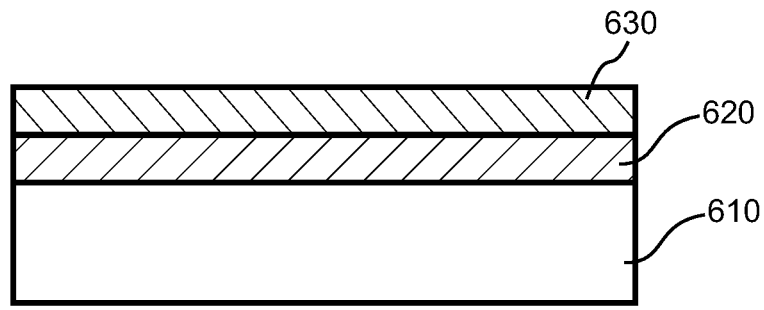
FIG. 6B shows a structure comprising a photoresist mask deposited on the silicon layer shown in FIG. 6A.

In a further step of the process, as shown in FIG. 6B, a photoresist mask (630) is deposited on the silicon layer (620).

Figure 6C:
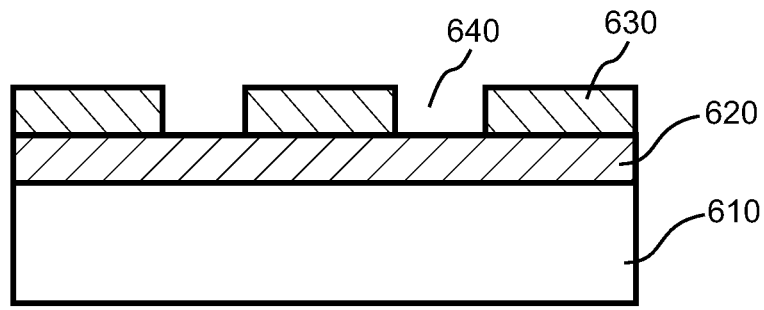
FIG. 6C shows the structure shown in FIG. 6B where a plurality of holes are formed in the photoresist mask.

As shown in FIG. 6C, the silicon layer (620) is then exposed through a plurality of openings (640) generated by exposing the photoresist (630) through processes known to the person skilled in the art.

Figure 6D:
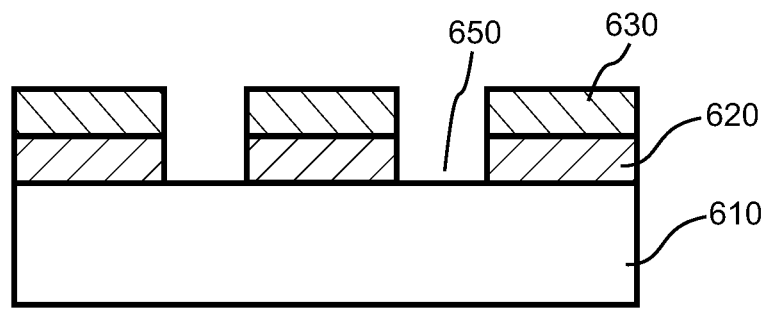
FIG. 6D shows the structure shown in FIG. 6C with a plularity of perforations formed in the silicon layer.

As shown in FIG. 6D, the SiO2 layer (610) is then exposed by generating perforations (650) in the silicon layer (620) by way of, for example, selective anisotropic etching of the silicon layer (620).

Figure 6E:
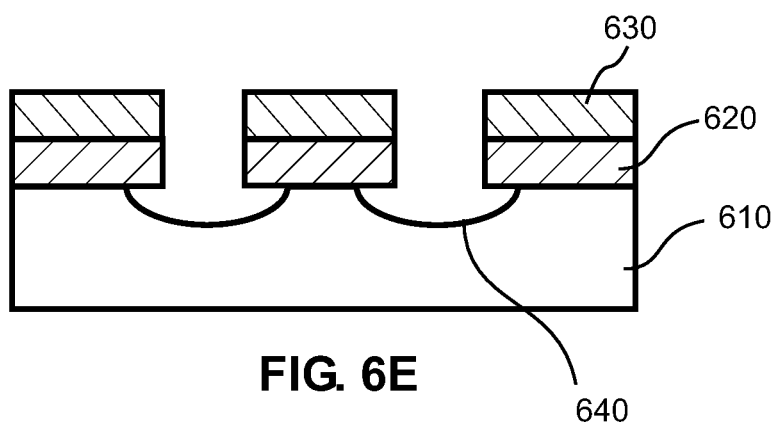
FIG. 6E shows the structure of FIG. 6D where anchor shaped holes are formed in the SiO2 layer.

According to the methods described in the present disclosure, in a further step, anchor shaped holes (640) are generated in the SiO2 layer (610), as shown in FIG. 6E.

Figure 6F:
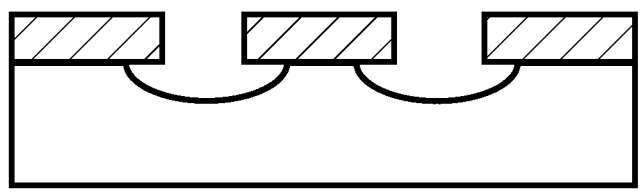
FIG. 6F shows the structure of FIG. 6E where the phtotoresist mask is removed.

FIG. 6F shows a further step of the process where the photoresist layer (630) is selectively removed (e.g, using acetone).

Figure 6G:
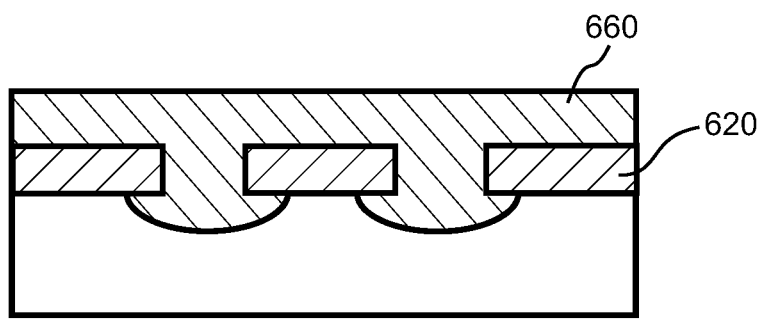
FIG. 6G shows the structure of FIG. 6F where a first layer is deposited on the silicon layer.

FIG. 6G shows a first layer (660) e.g., a PDMS layer, deposited on the silicon layer (620) in accordance with the methods described in the present disclosure, thereby filling the anchor shaped holes (640) previously generated in the SiO2 layer (610). In a further step of the process, the first PDMS layer (660) is partially cured (e.g., by heating).

Figure 6H:
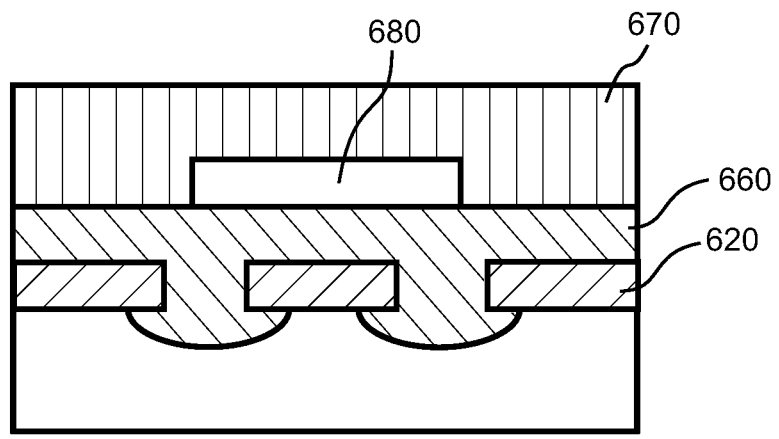
FIG. 6H shows a second layer bonded to the first layer shown in FIG. 6G.

In a subsequent step of the process, as shown in FIG. 6H, a second layer (670) e.g, a PDMS layer, is aligned with the first layer (660) and then bonded to the first layer (660) by way of, for example, soft lithographic techniques. The second layer (670) can be premolded (e.g., using standard soft lithographic techniques) and comprises a microfluidic channel (680). In a final step of the process, the first layer (660) and the second layer (670) are fully cured using, for example, thermal treatment.

The present disclosure has shown methods for efficient adhesion of two layers of materials. While the methods have been described by means of specific embodiments and applications thereof, it is understood that numerous modifications and variations could be made thereto by those skilled in the art without departing from the spirit and scope of the disclosure. It is therefore to be understood that within the scope of the claims, the disclosure may be practiced otherwise than as specifically described herein.

The invention claimed is:

1. A method for adhering a microfluidic chip to a substrate comprising:

providing a first layer;
providing a second layer;
providing a third layer;
providing a fourth layer;
providing a fifth layer having at least one microfluidic channel;
depositing the second layer on the first layer;
depositing the third layer on the second layer;
exposing the second layer by forming one or more openings in the third layer;
after said exposing the second layer, performing one or more perforations through the second layer to expose the first layer through the one or more perforations;
after said performing one or more perforations through the second layer, undercutting the second layer through at least one of the one or more perforations to provide at least one anchor shaped hole in the first layer, the at least one anchor shaped hole having a width larger than the at least one of the one or more perforations;
after said undercutting the second layer through at least one of the one or more perforations, selectively removing the third layer;
after said selectively removing the third layer, depositing the fourth layer on the second layer thus filling the at least one anchor shaped hole;
after said depositing the fourth layer, aligning the fifth layer with the fourth layer; and
after said aligning the fifth layer, bonding the fifth layer to the fourth layer.

2. The method of claim 1, wherein the fourth layer and the fifth layer are made of polydimethylsiloxane (PDMS).

3. The method of claim 1, wherein after said bonding the fifth layer to the fourth layer, the fourth and the fifth layer are fully cured.

\* \* \* \* \*